(12) United States Patent
Aeloiza et al.

(10) Patent No.: US 11,128,290 B2
(45) Date of Patent: Sep. 21, 2021

(54) TEMPERATURE-ADAPTIVE SHORT CIRCUIT PROTECTION FOR SEMICONDUCTOR SWITCHES

(71) Applicant: ABB Schweiz AG, Baden (CH)

(72) Inventors: Eddy Aeloiza, Apex, NC (US); Arun Kumar Kadavelugu, Raleigh, NC (US)

(73) Assignee: ABB Schweiz AG, Baden (CH)

(\*) Notice: Subject to any disclaimer, the term of this patent is extended or adjusted under 35 U.S.C. 154(b) by 147 days.

(21) Appl. No.: 16/520,532

(22) Filed: Jul. 24, 2019

(65) Prior Publication Data
US 2021/0028778 A1 Jan. 28, 2021

(51) Int. Cl.
| H02H 5/00 | (2006.01) |
| H03K 17/082 | (2006.01) |
| G01R 19/165 | (2006.01) |
| G01R 31/26 | (2020.01) |
| H02H 1/00 | (2006.01) |
| H03K 5/24 | (2006.01) |

(52) U.S. Cl.
CPC ... *H03K 17/0822* (2013.01); *G01R 19/16519* (2013.01); *G01R 31/2621* (2013.01); *H02H 1/0007* (2013.01); *H03K 5/24* (2013.01)

(58) Field of Classification Search
None
See application file for complete search history.

(56) References Cited

U.S. PATENT DOCUMENTS

| 6,992,452 B1* | 1/2006 | Sachs | H02P 29/032 |
| | | | 318/434 |
| 7,274,243 B2 | 9/2007 | Pace et al. | |
| 7,466,185 B2 | 12/2008 | Bayerer | |
| 8,243,407 B2* | 8/2012 | Fukami | H03K 17/0822 |
| | | | 361/78 |

(Continued)

OTHER PUBLICATIONS

B. Wittig et al., "Analysis and Design Aspects of a Desaturation Detection Circuit for Low Voltage Power MOSFETs," Proceedings of the 14th International Power Electronics and Motion Control Conference EPE-PEMC 2010, dated Oct. 21, 2010, pp. 7-12, IEEE, Piscataway, USA.

(Continued)

*Primary Examiner* — Stephen W Jackson
(74) *Attorney, Agent, or Firm* — Leydig, Voit & Mayer, Ltd.

(57) ABSTRACT

Systems, methods, techniques and apparatuses of short circuit protection are disclosed. One exemplary embodiment is a method for protecting a semiconductor switch comprising receiving a measurement corresponding to an electrical characteristic of the semiconductor switch; determining a semiconductor switch resistance value using the received measurement; estimating a junction temperature of the semiconductor switch using the semiconductor switch resistance value; determining a short circuit voltage threshold using the estimated junction temperature; comparing the short circuit voltage threshold to a test voltage corresponding to a drain-source voltage of the semiconductor switch; determining a short circuit condition is occurring in response to comparing (Continued)

the short circuit voltage threshold and the test voltage; and opening the semiconductor switch in response to determining the short circuit condition is occurring.

20 Claims, 4 Drawing Sheets

(56) References Cited

U.S. PATENT DOCUMENTS

| 10,171,069 | B1 | 1/2019 | Zoels et al. | |
|---|---|---|---|---|
| 10,393,795 | B2* | 8/2019 | Aeloiza | H03K 17/687 |
| 2011/0210713 | A1 | 9/2011 | Kazama | |
| 2019/0033362 | A1 | 1/2019 | Aeloiza et al. | |
| 2019/0204889 | A1 | 7/2019 | Kaeriyama et al. | |

OTHER PUBLICATIONS

R. Singh et al., "Short Circuit Robustness of 1200 V SiC Switches," 2015 IEEE 3rd Workshop on Wide Bandgap Power Devices and Applications (WiPDA), dated Jan. 4, 2016, 4 pp., IEEE, Piscataway, USA.

R. S. Chokhawala et al., "A Discussion on IGBT Short-Circuit Behavior and Fault Protection Schemes," IEEE Transactions on Industry Applications, dated Mar./Apr. 1995, pp. 256-263, vol. 31, No. 2, IEEE, Piscataway, USA.

L. Dulau et al., "A New Gate Driver Integrated Circuit for IGBT Devices With Advanced Protections," IEEE Transactions on Power Electronics, dated Jan. 3, 2006, pp. 38-44, vol. 21, No. 1, IEEE, Piscataway, USA.

J. Wang et al., "Design of a High-Bandwidth Rogowski Current Sensor for Gate-Drive Shortcircuit Protection of 1.7 kV SiC MOSFET Power Modules," 2015 IEEE 3rd Workshop on Wide Bandgap Power Devices and Applications (WiPDA), dated Jan. 4, 2016, pp. 104-107, IEEE, Piscataway, USA.

* cited by examiner

| Amps | 125°C | 112.5°C | 100°C | 87.5°C | 75°C | 62.5°C | 50°C | 37.5°C | 25°C |
|---|---|---|---|---|---|---|---|---|---|
| | | | | R$_{sd\_on}$ in mOhm for given temperature | | | | | |
| 20 | 7.08 | 6.66 | 6.24 | 5.82 | 5.39 | 5.07 | 4.74 | 4.42 | 4.09 |
| 40 | 7.06 | 6.64 | 6.22 | 5.80 | 5.38 | 5.05 | 4.73 | 4.41 | 4.09 |
| 60 | 7.04 | 6.62 | 6.20 | 5.78 | 5.36 | 5.04 | 4.72 | 4.40 | 4.08 |
| 80 | 7.02 | 6.60 | 6.18 | 5.76 | 5.34 | 5.03 | 4.71 | 4.39 | 4.07 |
| 100 | 7.00 | 6.58 | 6.16 | 5.75 | 5.33 | 5.01 | 4.69 | 4.38 | 4.06 |
| 120 | 6.98 | 6.56 | 6.14 | 5.73 | 5.31 | 5.00 | 4.68 | 4.37 | 4.05 |
| 140 | 6.95 | 6.54 | 6.13 | 5.71 | 5.30 | 4.98 | 4.67 | 4.36 | 4.04 |
| 160 | 6.93 | 6.52 | 6.11 | 5.69 | 5.28 | 4.97 | 4.66 | 4.35 | 4.04 |
| 180 | 6.91 | 6.50 | 6.09 | 5.68 | 5.26 | 4.95 | 4.65 | 4.34 | 4.03 |
| 200 | 6.89 | 6.48 | 6.07 | 5.66 | 5.25 | 4.94 | 4.63 | 4.33 | 4.02 |
| 220 | 6.87 | 6.46 | 6.05 | 5.64 | 5.23 | 4.93 | 4.62 | 4.32 | 4.01 |
| 240 | 6.85 | 6.44 | 6.03 | 5.62 | 5.21 | 4.91 | 4.61 | 4.31 | 4.00 |
| 260 | 6.83 | 6.42 | 6.01 | 5.61 | 5.20 | 4.90 | 4.60 | 4.30 | 4.00 |
| 280 | 6.81 | 6.40 | 6.00 | 5.59 | 5.18 | 4.88 | 4.58 | 4.29 | 3.99 |
| 300 | 6.79 | 6.38 | 5.98 | 5.57 | 5.16 | 4.87 | 4.57 | 4.28 | 3.98 |
| 320 | 6.77 | 6.36 | 5.96 | 5.55 | 5.15 | 4.85 | 4.56 | 4.26 | 3.97 |
| 340 | 6.75 | 6.34 | 5.94 | 5.54 | 5.13 | 4.84 | 4.55 | 4.25 | 3.96 |
| 360 | 6.73 | 6.32 | 5.92 | 5.52 | 5.12 | 4.82 | 4.53 | 4.24 | 3.95 |
| 380 | 6.71 | 6.31 | 5.90 | 5.50 | 5.10 | 4.81 | 4.52 | 4.23 | 3.95 |

Fig. 2

TEMPERATURE-ADAPTIVE SHORT CIRCUIT PROTECTION FOR SEMICONDUCTOR SWITCHES

BACKGROUND

The present disclosure relates generally to short circuit protection. Wide bandgap semiconductor switches are becoming increasingly more common in power electronic applications such as motor drive units, to name but one example. While wide bandgap switches offer very high switching frequencies and low switching losses, they are more susceptible to short circuit currents than other semiconductor switches. For example, many wide bandgap devices only tolerate short circuit currents for less than 1 us. Existing semiconductor control circuits suffer from a number of shortcomings and disadvantages. There remain unmet needs including increasing fault response, reducing short circuit current peaks, and increasing reliability. For instance, a fixed drain-voltage threshold for detecting short circuits may need to be set at a high value to account for temperature dependency of a drain-source voltage. Consequently, a semiconductor switch operating at a low temperature experiences a longer protection delay compared to the same semiconductor switch operating at a higher temperature. In view of these and other shortcomings in the art, there is a significant need for the unique apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY OF THE DISCLOSURE

Exemplary embodiments of the disclosure include unique systems, methods, techniques and apparatuses for semiconductor switch short circuit protection. Further embodiments, forms, objects, features, advantages, aspects and benefits of the disclosure shall become apparent from the following description and drawings.

BRIEF DESCRIPTION OF THE DRAWINGS

FIG. 2 is a table illustrating an exemplary junction temperature lookup table.

DETAILED DESCRIPTION OF ILLUSTRATIVE EMBODIMENTS

Figure 1:
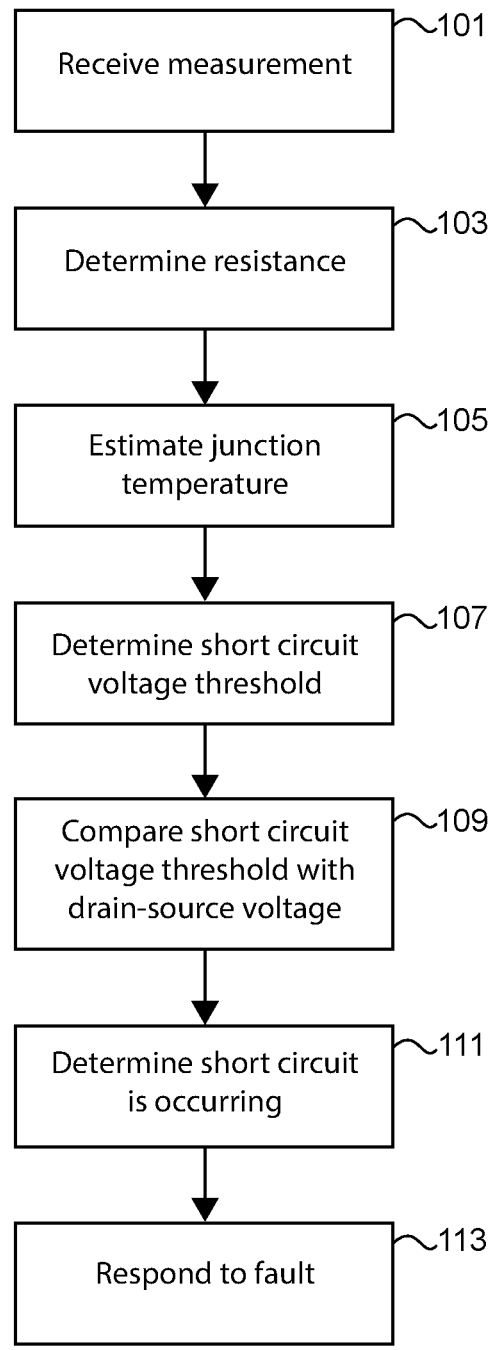
FIG. 1 is a flow chart illustrating an exemplary process for semiconductor short circuit protection.

With reference to FIG. 1, there is illustrated an exemplary process 100 for protecting a semiconductor switch from a short circuit condition. In certain embodiments, the semiconductor switch includes a wide bandgap device, such as a silicon carbide (SiC) metal-oxide-semiconductor field-effect transistor (MOSFET), a gallium nitride (GaN) switch, to name but a few examples. In certain embodiments, the semiconductor switch includes a junction gate field-effect transistor (JFET) or a silicon MOSFET, to name but a few examples. The semiconductor switch includes two terminals, known as a drain and a source, connected by a channel. A voltage received at a third terminal of the semiconductor switch, known as a gate, controls whether the channel allows current to flow between the drain and the source. If the switch is open, no current flows through the channel. If the switch is closed, current may flow between the drain and source through the channel.

Figure 3:
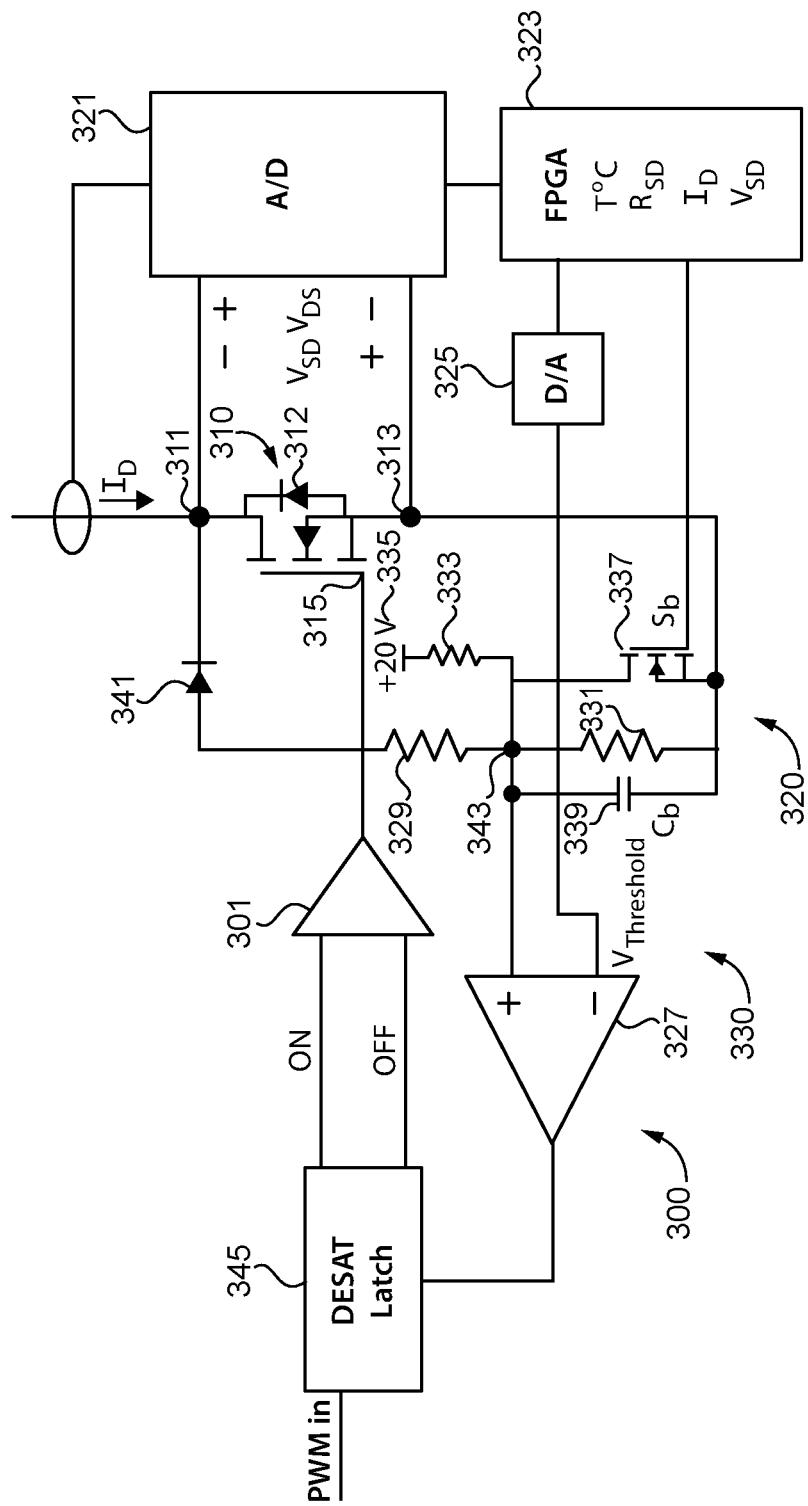
FIG. 3 is a circuit diagram illustrating an exemplary semiconductor control circuit for protecting a semiconductor switch using the exemplary process of FIG. 1.

Process 100 is implemented by a semiconductor control system, such as semiconductor control system 300 illustrated in FIG. 3 to name but one example. It shall be further appreciated that a number of variations and modifications to process 100 are contemplated including, for example, the omission of one or more aspects of process 100, the addition of further conditionals or operations, or the reorganization or separation of operations and conditionals into separate processes.

Process 100 begins at operation 101 where the control system is structured to receive at least one measurement corresponding to an electrical characteristic of the semiconductor switch. For example, the control system may receive measurements corresponding to a voltage from the drain to the source, known as drain-source voltage; a current flowing from the drain to the source through the channel, known as drain-source current, a current flowing through a phase leg of a power converter into which the semiconductor switch is incorporated, known as phase-leg current; a voltage from the source to the drain, known as source-drain voltage; or a current flowing from the source to the drain through the channel, known as source-drain current, to name but a few examples. Each current or voltage measurement may include a magnitude, to name but one example.

In certain embodiments, operation 101 is performed while the semiconductor switch is closed and current is flowing from the drain to the source, also known as forward conduction mode. The measurements received during forward conduction mode may include drain-source voltage and a current measurement, such as drain-source current or phase-leg current, to name but a few examples.

In certain embodiments, operation 101 is performed while the semiconductor switch is closed and current is flowing from the drain to the source, also known as reverse conduction mode. The measurements received during reverse conduction mode may include source-drain voltage and a current measurement, such as source-drain current or phase-leg current, to name but a few examples.

Process 100 proceeds to operation 103 where the control system determines a semiconductor switch resistance value using the at least one received measurement. Where measurements are received during forward conduction mode, the control system may determine the semiconductor switch resistance value by calculating the resistance of the channel, known as a forward resistance value or forward channel resistance, using the drain-source voltage and a current measurement. Where measurements are received during reverse conduction mode, the control system may determine the semiconductor switch resistance value by calculating the resistance of the channel, known as a reverse resistance value or reverse channel resistance using the source-drain voltage and a current measurement. In certain embodiments, multiple voltage measurements and current measurements are used to determine forward channel resistance reverse channel resistance by averaging the results.

Process 100 proceeds to operation 105 where the control system estimates the junction temperature of the semiconductor switch using the semiconductor switch resistance value determined in operation 103. Semiconductor switches are structured to operate safely over a range of junction temperatures. For example, a semiconductor switch may operate with a junction temperature in a range between 25° C. and 125° C., to give but one example. In certain embodiments, estimating the junction temperature includes referencing a data structure, such as a lookup table, stored by a memory device of the control system. The lookup table may include a plurality of resistance value-current value combinations corresponding to one of a plurality of junction temperatures. The estimated junction temperature is the temperature in the lookup table corresponding to the determined semiconductor switch resistance value and current measurement combination. In certain embodiments, junction temperature may be estimated using an equation including variables for the semiconductor switch resistance value and a current measurement. In certain embodiments, process 100 may not include operation 103 and junction temperature may be estimated using a voltage at the gate of the semiconductor switch, known as gate voltage; a switching frequency; or another electrical or physical characteristic having a relationship with junction temperature.

Estimating junction temperatures using current and voltage measurements is preferable to using some measurements devices such as thermistors, since the large constant of a thermistor delays protection response. Furthermore, sudden increases in current combined with the large constant of a thermistor may cause a control system to erroneously open the semiconductor switch.

Process 100 proceeds to operation 107 where the control system determines a short circuit voltage threshold using the junction temperature estimated in operation 105. The short circuit voltage threshold is configured to be high enough to avoid erroneous fault response but low enough to respond to short circuit conditions quickly enough to avoid damaging the semiconductor switch. The drain-source voltage of a semiconductor switch not experiencing a fault condition may fluctuate over a range, such as 1V to 10V, to name but one example. Because the operating drain-source voltage of a semiconductor switch increases as junction temperature increases, the short circuit voltage threshold must also increase when the estimated junction temperature increases. For example, the short circuit voltage threshold may be determined to be 120% of a nominal drain-source voltage at the estimated temperature, to give but one example. By adapting the short circuit voltage threshold based on the estimated temperature, the control system is configured to detect a fault quickly for all junction temperatures of a semiconductor switch, even if semiconductor switch has a wide operating junction temperature range. The control system may determine the short circuit voltage threshold by referencing a data structure, such as a lookup table, stored by a memory device of the control system. The lookup table may include a plurality of junction temperatures values corresponding to one of a plurality of short circuit voltage thresholds. The determined short circuit voltage threshold is the threshold in the lookup table corresponding to the estimated junction temperature. In certain embodiments, the control system may determine the short circuit voltage threshold using an equation including a variable corresponding to estimated junction temperature.

Process 100 proceeds to operation 109 where the control system compares the short circuit voltage threshold to a test voltage corresponding to a drain-source voltage of the semiconductor switch. The test voltage may be a drain-source voltage received in operation 101 or a subsequent drain-source voltage. In certain embodiments, the test voltage may be proportional to the drain-source voltage.

Process 100 proceeds to operation 111 where the control system determines a short circuit condition is occurring in response to comparing the short circuit voltage threshold and the test voltage. For example, the control system may determine the test voltage corresponding to the drain-source voltage of the semiconductor switch exceeds the short circuit voltage threshold.

Process 100 proceeds to operation 113 where the control system responds to the determined short circuit fault condition determined in operation 111. The control system is configured to respond to a determined short circuit condition by opening the semiconductor switch before the semiconductor switch is damaged by the short circuit current regardless of the junction temperature. For example, the control system may be configured to respond to the fault condition within 1 us of receiving the measurement in operation 101 for all operating junction temperatures of the semiconductor switch, including both low and high temperature conditions. To give but one example, a range of operating junction temperatures for the semiconductor switch may be from 25° C. to 125° C. A low temperature condition may include the lowest quarter of the range of operating junction temperatures for a semiconductor switch and a high temperature condition may include the highest quarter of the range of operating junction temperatures for the semiconductor switch. In certain embodiments, the control system may be configured to respond to the fault condition within 0.25 us of receiving the measurement in operation 101 for all operating junction temperatures of the semiconductor switch. In certain embodiments, the control system may be configured to respond to the fault condition within 2 us of receiving the measurement in operation 101 for all operating junction temperatures of the semiconductor switch. In certain embodiments, the control system may be configured to respond to the fault condition within 10 us of receiving the measurement in operation 101 for all operating junction temperatures of the semiconductor switch.

Responding to the determined short circuit fault condition may include alerting a user. For example, a human machine interface (HMI) may display a visual or audible indictor corresponding to the determined short circuit condition. The HMI may be any device structured to actuate alarms or transmit warnings perceptible to a user, such as a display screen, a mobile device, or a control panel, to name but a few examples. In certain embodiments, the HMI is remote from the semiconductor switch. For example, the HMI may be an interface which receives information from a local control system by way of a communication network and a cloud-based computing device. Responding to the determined short circuit fault condition may include shutting down a power converter incorporating the semiconductor switch, to name but a few examples. It shall be appreciated that any or all of the foregoing features of the semiconductor control system or semiconductor switch may also be present in the other systems disclosed herein.

With reference to FIG. 2, there is illustrated an exemplary lookup table stored in a memory device of an exemplary semiconductor control system, such as the lookup table used in operation 105 of process 100 illustrated in FIG. 1. The lookup table includes a plurality of source-drain current values, reverse channel resistance values, and estimated temperatures. To estimate a junction temperature, a control system would use a drain-source current measurement and a determined reverse channel resistance. For example, if the control system received a source-drain current measurement of 20 amps and a determined reverse channel resistance of 7.08 mOhm, the control system would estimate the junction temperature to be 125° C.

With reference to FIG. 3, there is illustrated an exemplary semiconductor control system 300 structured to execute the exemplary semiconductor switch protection process 100 illustrated in FIG. 1. System 300 is structured to respond to a detected short circuit condition before semiconductor switch 310 is damaged over a range of operating temperatures while preventing erroneous fault response. It shall be appreciated that system 300 may be implemented in a variety of applications, including power converters used in power transmission networks, power distribution networks, or motor drives, to name but a few examples. It shall be appreciated that the arrangement of control system 300 is illustrated for the purpose of explanation and is not intended as a limitation of the present disclosure unless otherwise specified.

Semiconductor switch 310 includes a gate 315, a drain 311, and a source 313. Gate 315 is structured to control the flow of current $I_D$ between source 313 and drain 311 in response to received activation signals. In the illustrated embodiment, switch 310 is an n-channel SiC MOSFET which includes an intrinsic body diode 312. SiC MOSFETs are a type of wide bandgap semiconductor switch structured to allow current $I_D$ to flow through a channel from drain 311 to source 313, known as drain-source current, and from source 313 to drain 311, known as source-drain current.

In the illustrated embodiment, an analog to digital converter 321 is coupled to semiconductor 310 and structured to receive analog data corresponding to voltage and current measurements. For example, analog to digital converter 321 may receive data corresponding to drain-source voltage $V_{DS}$, source-drain voltage $V_{SD}$, current $I_D$, or phase-leg current, to name but a few examples. Converter 321 is structured to receive the analog data, convert the data to digital, and output digital measurements to a controller 323.

In certain embodiments, system 300 includes a plurality of sensors to measure voltage and current values. For example, a voltage sensor may be structured to measure drain-source voltage $V_{DS}$ and a current sensor may be used to measure current $I_D$. The plurality of sensors may include voltage transformers or current transformers structured to output a measurement proportional to the received voltage or current value. In certain embodiments, the plurality of sensors includes a phase-leg current sensor structured to measure current flowing through a phase leg of the converter. Using measurements corresponding to the current of the phase-leg and activation signals from gate driver 301, controller 323 may estimate $I_D$.

In the illustrated embodiment, controller 323 is a field programmable gate array. In certain embodiments, controller 323 may be another type of computing device, such as a complex programmable logic device, to name but one example. Controller 323 is structured to receive measurements from analog-to-digital converter 321, determine a semiconductor switch resistance value using the received measurements, estimate a junction temperature of the semiconductor switch using the semiconductor switch resistance value, and determine a short circuit voltage threshold using the estimated junction temperature. Controller 323 is also structured to store data for estimating the junction temperature. Once controller 323 determines the short circuit voltage threshold, controller 323 outputs the threshold to comparator 327 through digital-to-analog converter 325.

System 300 includes a plurality of components 330 structured to provide a test voltage corresponding to drain-source voltage $V_{DS}$ to a first terminal of comparator 327. The plurality of components includes capacitor 339; resistors 329, 331, and 333; semiconductor switch 337; direct current (DC) power supply 335; and diode 341.

Resistors 329 and 331 are coupled in series at a midpoint connection 343 and structured to generate a test voltage by dividing the drain-source voltage $V_{DS}$. Capacitor 339 and switch 337 are each coupled in parallel with resistor 331. Switch 337 includes a gate coupled to controller 323. DC power supply 335 is coupled to midpoint connection 343 by way of resistor 333. Diode 341 is coupled between resistor 329 and drain 311 and structured to prevent current flowing from drain 311 to resistor 329 through diode 341. Midpoint connection 343 is coupled to a first terminal of comparator 327. Controller 323 is coupled to a second terminal of comparator 327 by way of digital-to-analog converter 325 structured to convert digital signals from controller 323 to analog signals.

DC power supply 335 is structured to provide a DC charging current to capacitor 339. Switch 337 is operated by controller 323 to synchronize with the gate signal transmitted to semiconductor 310 by gate driver 301. When semiconductor 310 is off, switch 337 is closed to prevent a test voltage from being transmitted to comparator 327. When semiconductor switch 310 is on, switch 337 is opened after a first blanking period. Comparator 327 receives the test voltage after a second blanking period, during which capacitor 339 is charged.

Comparator 327 is structured to compare the short circuit voltage threshold received from controller 323 to the test voltage received from the plurality of components 330, determine a short circuit condition is occurring in response to comparing the short circuit voltage threshold and the test voltage, and transmit an output signal to a latch 345, effective to open semiconductor switch 310 in response to determining the short circuit condition is occurring. Latch 345 is structured to receive the output signal from comparator 327 and interrupt the operation of gate driver 301, thereby opening semiconductor switch 310.

In certain embodiments, the functions of comparator 327 may be performed instead by controller 323. In certain embodiments, comparator 327 consists of analog circuitry. In certain embodiments, comparator 327 includes a processing device such as a microprocessor or a field-programmable gate array. In certain embodiments, comparator 327 is structured to transmit the output signal within 10 ns of receiving the test voltage and the short circuit voltage threshold.

Figure 4:
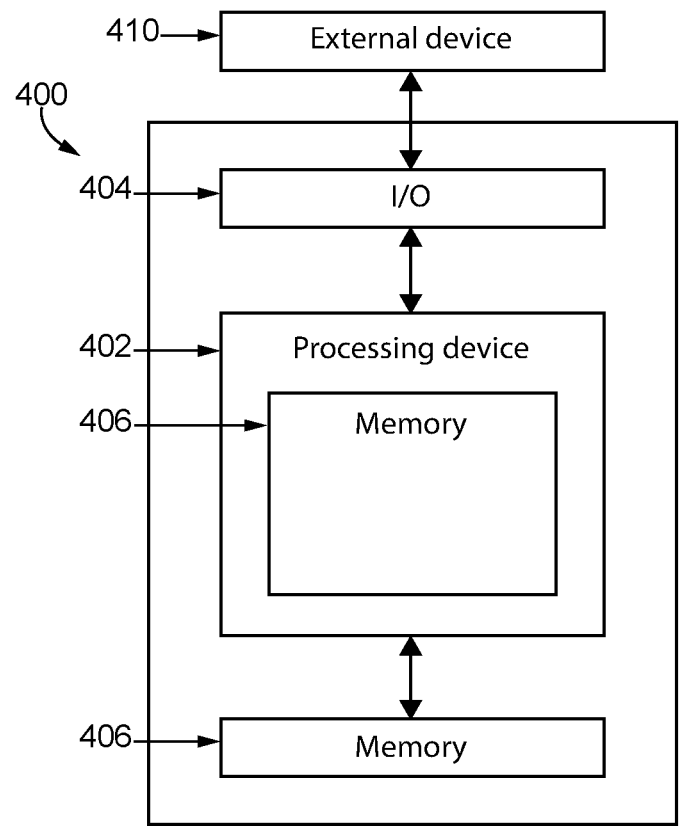
FIG. 4 is a block diagram illustrating an exemplary computing device.

With reference to FIG. 4, there is illustrated a schematic block diagram of a computing device 400. Computing device 400 is one example of a controller which is used, in different embodiments, in connection with an exemplary semiconductor monitoring system, such as controller 323 shown in FIG. 3. Computing device 400 includes a processing device 402, an input/output device 404, and a memory device 406. Computing device 400 may be a stand-alone device, an embedded system, or a plurality of devices structured to perform the functions described with respect to control system 121. Furthermore, computing device 400 communicates with one or more external devices 410.

Input/output device 404 enables the computing device 400 to communicate with an external device 410. For example, input/output device 404 in different embodiments may be a network adapter, network credential, interface, or a port (e.g., a USB port, serial port, parallel port, an analog port, a digital port, VGA, DVI, HDMI, FireWire, CAT 5, Ethernet, fiber, or any other type of port or interface), to name but a few examples. Input/output device 404 is comprised of hardware, software, and/or firmware. It is contemplated that input/output device 404 includes more than one of these adapters, credentials, or ports, such as a first port for receiving data and a second port for transmitting data.

External device 410, such as an HMI, sensor, or comparator, is any type of device that allows data to be input or output from computing device 400. For example, external device 410 in different embodiments is a sensor, a mobile device, a reader device, equipment, a handheld computer, a diagnostic tool, a controller, a computer, a server, a printer, a display, a visual indicator, a keyboard, a mouse, or a touch screen display. Furthermore, it is contemplated that external device 410 is integrated into computing device 400. It is further contemplated that more than one external device is in communication with computing device 400.

Processing device 402 in different embodiments is a programmable type, a dedicated, hardwired state machine, or a combination of these. Device 402 can further include multiple processors, Arithmetic-Logic Units (ALUs), Central Processing Units (CPUs), Digital Signal Processors (DSPs), Field-programmable Gate Array (FPGA), to name but a few examples. For forms of processing device 402 with multiple processing units, distributed, pipelined, or parallel processing can be used as appropriate. Processing device 402 may be dedicated to performance of just the operations described herein or may be utilized in one or more additional applications. In the illustrated form, processing device 402 is of a programmable variety that executes processes and processes data in accordance with programming instructions (such as software or firmware) stored in memory device 406. Alternatively or additionally, programming instructions are at least partially defined by hardwired logic or other hardware. Processing device 402 can be comprised of one or more components of any type suitable to process the signals received from input/output device 404 or elsewhere, and provide desired output signals. Such components may include digital circuitry, analog circuitry, or a combination of both.

Memory device 406 in different embodiments is of one or more types, such as a solid-state variety, electromagnetic variety, optical variety, or a combination of these forms, to name but a few examples. Furthermore, memory device 406 can be volatile, nonvolatile, transitory, non-transitory or a combination of these types, and some or all of memory device 406 can be of a portable variety, such as a disk, tape, memory stick, or cartridge, to name but a few examples. In addition, memory device 406 can store data that is manipulated by processing device 402, such as data representative of signals received from or sent to input/output device 404 in addition to or in lieu of storing programming instructions, just to name one example. As shown in FIG. 4, memory device 406 may be included with processing device 402 or coupled to processing device 402, but need not be included with both.

Further written description of a number of exemplary embodiments shall now be provided. One embodiment is a method for protecting a semiconductor switch comprising: receiving a measurement corresponding to an electrical characteristic of the semiconductor switch; determining a semiconductor switch resistance value using the received measurement; estimating a junction temperature of the semiconductor switch using the semiconductor switch resistance value; determining a short circuit voltage threshold using the estimated junction temperature; comparing the short circuit voltage threshold to a test voltage corresponding to a drain-source voltage of the semiconductor switch; determining a short circuit condition is occurring in response to comparing the short circuit voltage threshold and the test voltage; and opening the semiconductor switch in response to determining the short circuit condition is occurring.

In certain forms of the foregoing method, the semiconductor switch includes a silicon carbide metal-oxide-semiconductor field-effect transistor (SiC MOSFET) or a gallium nitride (GaN) switch. In certain forms, the method comprises: receiving a current measurement corresponding a current flowing from a drain to a source of the semiconductor switch, wherein the received measurement is a drain-source voltage measurement, wherein determining a semiconductor switch resistance value includes using the received current measurement, and wherein the semiconductor switch resistance value is a forward channel resistance of the semiconductor switch. In certain forms, the received measurement is a voltage measurement corresponding to a voltage from a source to a drain of the semiconductor switch during reverse conduction mode, and wherein the semiconductor switch resistance value is a reverse channel resistance. In certain forms, estimating the junction temperature includes referencing a lookup table. In certain forms, opening the semiconductor switch occurs within 0.25 us of receiving the measurement. In certain forms, opening the semiconductor switch occurs within 1 us of receiving the measurement for all operating junction temperatures for the semiconductor switch. In certain forms, opening the semiconductor switch occurs within 1 us of receiving the measurement, and wherein the estimated junction temperature corresponds to a low temperature condition. In certain forms, the method comprises operating a control system including a controller and a comparator. In certain forms, the semiconductor switch is incorporated into a power converter, wherein the method comprises shutting down the power converter in response to determining the short circuit condition is occurring.

Another exemplary embodiment is a semiconductor control system for a semiconductor switch comprising: a controller structured to receive a measurement of an electrical characteristic of the semiconductor switch, determine a semiconductor switch resistance value using the received measurement, estimate a junction temperature of the semiconductor switch using the semiconductor switch resistance value, and determine an short circuit voltage threshold using the estimated junction temperature; and a comparator structured to compare the short circuit voltage threshold to a test voltage corresponding to a drain-source voltage of the semiconductor switch, determine a short circuit condition is occurring in response to comparing the short circuit voltage threshold and the test voltage, and transmit an output signal in response to determining the short circuit condition is occurring.

In certain forms of the foregoing semiconductor control system, the semiconductor switch includes a silicon carbide metal-oxide-semiconductor field-effect transistor (SiC MOSFET) or a gallium nitride (GaN) switch. In certain forms, the received measurement is a drain-source voltage measurement, and wherein the semiconductor switch resistance value is a forward channel resistance of the semiconductor switch. In certain forms, the received measurement is a voltage measurement corresponding to a voltage from a source to a drain of the semiconductor switch during reverse conduction mode, and wherein the semiconductor switch resistance value is a reverse channel resistance. In certain forms, estimating the junction temperature includes referencing a lookup table. In certain forms, transmitting the output signal is effective to cause a gate driver to open the semiconductor switch. In certain forms, opening the semiconductor switch occurs within 0.25 us of receiving the measurement. In certain forms, opening the semiconductor switch occurs within 1 us of receiving the measurement for all operating junction temperatures for the semiconductor switch. In certain forms, opening the semiconductor switch occurs within 1 us of receiving the measurement, and wherein the estimated junction temperature corresponds to a low temperature condition. In certain forms, the semiconductor switch is incorporated into a power converter, and wherein the output signal is effective to shut down the power converter.

It is contemplated that the various aspects, features, processes, and operations from the various embodiments may be used in any of the other embodiments unless expressly stated to the contrary. Certain operations illustrated may be implemented by a computer including a processing device executing a computer program product on a non-transient, computer-readable storage medium, where the computer program product includes instructions causing the processing device to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described, and that all changes and modifications that come within the spirit of the present disclosure are desired to be protected. It should be understood that while the use of words such as "preferable," "preferably," "preferred" or "more preferred" utilized in the description above indicate that the feature so described may be more desirable, it nonetheless may not be necessary, and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with, or a connection to, another item, as well as a belonging to, or a connection with, the other item as informed by the context in which it is used. The terms "coupled to," "coupled with" and the like include indirect connection and coupling, and further include but do not require a direct coupling or connection unless expressly indicated to the contrary. When the language "at least a portion" and/or "a portion" is used, the item can include a portion and/or the entire item unless specifically stated to the contrary.

What is claimed is:

1. A method for protecting a semiconductor switch comprising:
   receiving a measurement corresponding to an electrical characteristic of the semiconductor switch;
   determining a semiconductor switch resistance value using the received measurement;
   estimating a junction temperature of the semiconductor switch using the semiconductor switch resistance value;
   determining a short circuit voltage threshold using the estimated junction temperature;
   comparing the short circuit voltage threshold to a test voltage corresponding to a drain-source voltage of the semiconductor switch;
   determining a short circuit condition is occurring in response to comparing the short circuit voltage threshold and the test voltage; and
   opening the semiconductor switch in response to determining the short circuit condition is occurring.

2. The method of claim 1, wherein the semiconductor switch includes a silicon carbide metal-oxide-semiconductor field-effect transistor (SiC MOSFET) or a gallium nitride (GaN) switch.

3. The method of claim 1, further comprising:
   receiving a current measurement corresponding a current flowing from a drain to a source of the semiconductor switch,
   wherein the received measurement is a drain-source voltage measurement,
   wherein determining a semiconductor switch resistance value includes using the received current measurement, and
   wherein the semiconductor switch resistance value is a forward channel resistance of the semiconductor switch.

4. The method of claim 1 wherein the received measurement is a voltage measurement corresponding to a voltage from a source to a drain of the semiconductor switch during reverse conduction mode, and wherein the semiconductor switch resistance value is a reverse channel resistance.

5. The method of claim 1 wherein estimating the junction temperature includes referencing a lookup table.

6. The method of claim 1 wherein opening the semiconductor switch occurs within 0.25 us of receiving the measurement.

7. The method of claim 1 wherein opening the semiconductor switch occurs within 1 us of receiving the measurement for all operating junction temperatures for the semiconductor switch.

8. The method of claim 1 wherein opening the semiconductor switch occurs within 1 us of receiving the measurement, and wherein the estimated junction temperature corresponds to a low temperature condition.

9. The method of claim 1 comprising operating a control system including a controller and a comparator.

10. The method of claim 1 wherein the semiconductor switch is incorporated into a power converter, wherein the method comprises shutting down the power converter in response to determining the short circuit condition is occurring.

11. A semiconductor control system for a semiconductor switch comprising:
   a controller structured to receive a measurement of an electrical characteristic of the semiconductor switch, determine a semiconductor switch resistance value using the received measurement, estimate a junction temperature of the semiconductor switch using the semiconductor switch resistance value, and determine a short circuit voltage threshold using the estimated junction temperature; and a comparator structured to compare the short circuit voltage threshold to a test voltage corresponding to a drain-source voltage of the semiconductor switch, determine a short circuit condition is occurring in response to comparing the short circuit voltage threshold and the test voltage, and transmit an output signal in response to determining the short circuit condition is occurring before the semiconductor switch is damaged by the short circuit current.

12. The semiconductor control system of claim 11, wherein the semiconductor switch includes a silicon carbide metal-oxide-semiconductor field-effect transistor (SiC MOSFET) or a gallium nitride (GaN) switch.

13. The semiconductor control system of claim 11, wherein the received measurement is a drain-source voltage measurement, and wherein the semiconductor switch resistance value is a forward channel resistance of the semiconductor switch.

14. The semiconductor control system of claim 11 wherein the received measurement is a voltage measurement corresponding to a voltage from a source to a drain of the semiconductor switch during reverse conduction mode, and wherein the semiconductor switch resistance value is a reverse channel resistance.

15. The semiconductor control system of claim 11 wherein estimating the junction temperature includes referencing a lookup table.

16. The semiconductor control system of claim 11 wherein transmitting the output signal is effective to cause a gate driver to open the semiconductor switch.

17. The semiconductor control system of claim 16 wherein opening the semiconductor switch occurs within 0.25 us of receiving the measurement.

18. The semiconductor control system of claim 16 wherein opening the semiconductor switch occurs within 1 us of receiving the measurement for all operating junction temperatures for the semiconductor switch.

19. The semiconductor control system of claim 16 wherein opening the semiconductor switch occurs within 1 us of receiving the measurement, and wherein the estimated junction temperature corresponds to a low temperature condition.

20. The semiconductor control system of claim 11 wherein the semiconductor switch is incorporated into a power converter, and wherein the output signal is effective to shut down the power converter.

* * * * *